(12) United States Patent
Pellizzer et al.

(10) Patent No.: US 8,988,926 B2
(45) Date of Patent: Mar. 24, 2015

(54) METHOD, SYSTEM AND DEVICE FOR PHASE CHANGE MEMORY WITH SHUNT

(71) Applicant: Micron Technology, Inc., Boise, ID (US)

(72) Inventors: Fabio Pellizzer, Cornate d'Adda (IT); Innocenzo Tortorelli, Cernusco Sul Naviglio (IT); Andrea Ghetti, Concorezzo (IT)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 13/739,387

(22) Filed: Jan. 11, 2013

(65) Prior Publication Data
US 2014/0198565 A1   Jul. 17, 2014

(51) Int. Cl.
*G11C 11/00* (2006.01)
*H01L 45/00* (2006.01)
*G11C 13/00* (2006.01)
*H01L 27/24* (2006.01)

(52) U.S. Cl.
CPC ............ *H01L 45/06* (2013.01); *G11C 13/0004* (2013.01); *H01L 45/12* (2013.01); *H01L 45/124* (2013.01); *H01L 45/144* (2013.01); *H01L 45/1691* (2013.01); *H01L 27/2445* (2013.01); *H01L 27/2463* (2013.01)
USPC .......................................... 365/148

(58) Field of Classification Search
USPC .......................................... 365/148
See application file for complete search history.

(56) References Cited

U.S. PATENT DOCUMENTS

| | | | |
|---|---|---|---|
| 7,639,526 B2 | 12/2009 | Pellizzer et al. | |
| 7,701,749 B2 | 4/2010 | Jeong et al. | |
| 7,965,545 B2 | 6/2011 | Savransky et al. | |
| 7,969,798 B2 | 6/2011 | Hwang et al. | |
| 8,039,297 B2 | 10/2011 | Kim et al. | |
| 2005/0167656 A1* | 8/2005 | Sun et al. | 257/30 |
| 2006/0249725 A1 | 11/2006 | Lee | |
| 2007/0099405 A1 | 5/2007 | Oliva et al. | |
| 2009/0067230 A1 | 3/2009 | Koh et al. | |
| 2009/0180314 A1 | 7/2009 | Liu | |
| 2010/0093130 A1 | 4/2010 | Oh et al. | |
| 2010/0165719 A1 | 7/2010 | Pellizzer | |
| 2010/0284212 A1 | 11/2010 | Bedeschi et al. | |
| 2010/0290277 A1* | 11/2010 | Happ et al. | 365/163 |
| 2011/0317481 A1 | 12/2011 | Franceschini et al. | |
| 2013/0026436 A1* | 1/2013 | Breitwisch et al. | 257/4 |
| 2014/0010005 A1* | 1/2014 | Redaelli | 365/163 |

FOREIGN PATENT DOCUMENTS

EP   2 034 536 A1   3/2009

* cited by examiner

*Primary Examiner* — Hoai V Ho
(74) *Attorney, Agent, or Firm* — Knobbe, Martens, Olson & Bear LLP

(57) ABSTRACT

Embodiments disclosed herein may relate to forming a storage component comprising a phase change material and a shunt relative to amorphous portions of the phase change material.

32 Claims, 13 Drawing Sheets

METHOD, SYSTEM AND DEVICE FOR PHASE CHANGE MEMORY WITH SHUNT

FIELD

Subject matter disclosed herein relates to integrated circuit devices generally, and more particularly, to phase change memory cells.

BACKGROUND

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering a memory device's suitability for any particular application may include, physical size, storage density, operating voltages, granularity of read/write operations, throughput, transmission rate, and/or power consumption, for example. Other example factors that may be of interest to system designers include cost of manufacture, and/or ease of manufacture.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
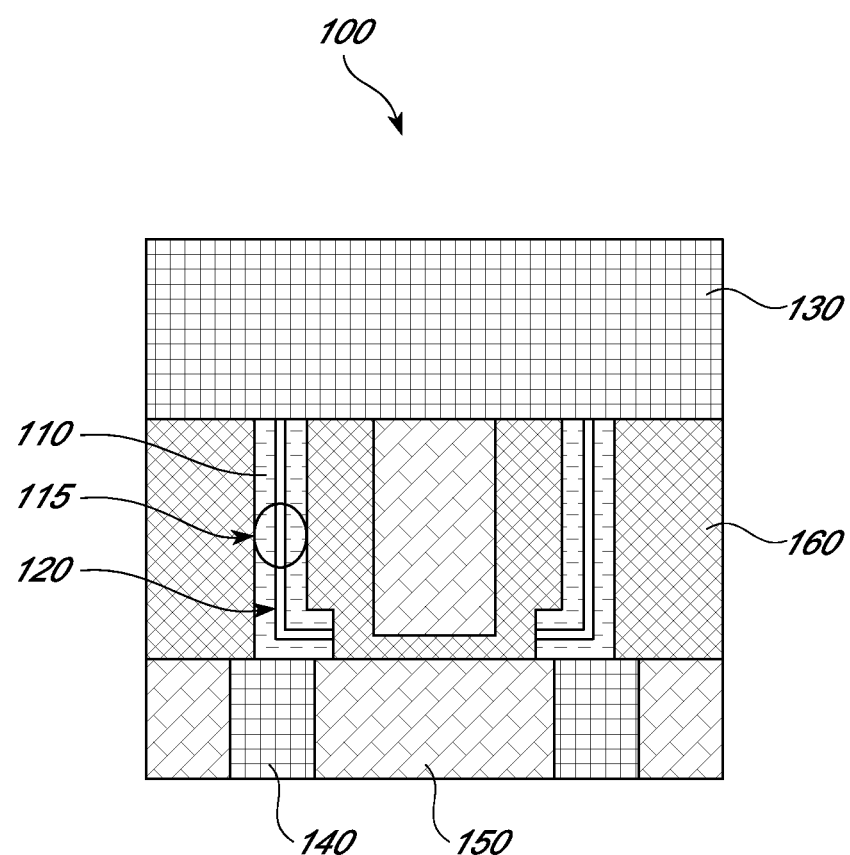
FIG. 1 is an illustration depicting a cross-sectional view of a portion of an example phase change memory device, according to an embodiment.

Reference is made in the following detailed description to the accompanying drawings, which form a part hereof, wherein like numerals may designate like parts throughout to indicate corresponding and/or analogous elements. It will be appreciated that elements illustrated in the figures have not necessarily been drawn to scale, such as for simplicity and/or clarity of illustration. For example, dimensions of some elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION OF THE PREFERRED EMBODIMENT

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a memory device that may be of interest in considering a memory device's suitability for a particular application may include physical size, storage density, operating voltages, granularity of read/write operations, throughput, transmission rate, and/or power consumption. Other example factors that may be of interest may include cost of manufacture, and/or ease of manufacture. One example aspect of memory array design that may affect one or more factors may include integrated circuit die size. One or more process technologies utilized to manufacture a memory device may at least in part determine at least some of the factors, such as those mentioned above, including storage density, physical size, and/or cost/ease of manufacture, for example.

In some embodiments, a number of factors listed above may be positively affected by implementing binary or multi-level storage cells in a memory array. For example, a phase change memory (PCM) storage component may be configured to retain or store memory in at least two different selectable states. In a binary system, the states are considered either a "0" or a "1,", where a "set" state, representing a binary value of "1," for example, may correspond to a more crystalline, more conductive state for a material of a storage component and a "reset" state, representing a binary value of "0," for example, corresponding to a more amorphous, more resistive state of a storage component material. In multi-level cell memory devices, at least some individual memory cells may be configured to store more than two resistivity levels to represent more than two states of information, such as set, reset and one or more intermediate resistivity levels. In a PCM memory array, heat sufficient to change a phase of a storage component may be achieved by application of a current and/or voltage pulse to the storage component, in an embodiment. An amount of discrete states that may be achieved in a multi-level cell may depend, at least in part, on one or more physical characteristics of a memory cell and/or on programming algorithms by which voltage and/or current signals may be applied to a memory cell.

Resistance characteristics of phase change material of a binary or multi-level memory cell may drift over time with or without thermal cycling. Thermal cycling can independently contribute to resistance drift as the phase change material and/or neighboring cells are subjected to repeated programming and/or erase operations. Such a drift in resistance characteristics may negatively affect memory device reliability, in that it may become more difficult for decoding circuitry to accurately discern an intended programming state from one or more other programming states. Drift can be particularly problematic for multi-level PCM embodiments, where differentiation among multiple resistance levels can be made even more difficult by drift in resistance that rivals the resistance differences among states.

FIG. 1 is an illustration depicting a cross-sectional view of a portion of an example embodiment 100 of a phase change memory device. In an embodiment, a memory cell, for example a multi-level cell, may comprise a storage component that may comprise a phase change memory material 110 and a lamina 120 comprising an electrically conductive material that may be chosen according to desired resistive characteristics. A memory cell may be positioned, for example, between a first electrode and a second electrode. In the illustrated vertically oriented memory cell, the memory storage component is positioned between a top electrode 130 and a bottom electrode 140, which may be electrode lines (column and row electrodes) or plugs in direct or indirect contact with such electrode lines. FIG. 1 shows two cells with two storage components embedded in insulating material 160, the storage components extending between individual bottom electrodes 140 and a common top electrode 130. The bottom electrodes 140 are also shown embedded in insulating material 150. In an embodiment, application of an appropriate voltage and/or current signal across electrodes 130 and 140 may result in an amorphous region 115 in phase change material 110.

In a multi-level embodiment, levels of resistance may be proportional to a length of amorphous region 115 along the direction of current travel between electrodes 130 and 140, which is a vertical length in the illustrated embodiment. Lamina 120 may provide a resistive shunt positioned in parallel to amorphous region 115. In the illustrated embodiment, the lamina 120 is positioned within phase change material 110. Lamina 120 may provide more stable resistive characteristics for a storage cell over the life of a memory device, as compared to the amorphous state of phase change material 110. For a multi-level implementation, variations in the length of amorphous region 115 resulting from application of different programming signals (e.g., current pulses) may result in different levels of resistance that may be detected by sensing circuitry in a memory device.

In one or more embodiments, lamina 120 may comprise electrically conductive material that may be selected to provide a shunt during one or more state(s) of the phase change material, such that in reset and intermediate states (if any), a majority of current flow through the cell is shunted to the lamina 120 and the resistance of the cell is largely determined by the material of the lamina 120, which is not subject to drift. The material of lamina 120 may be selected as a trade-off between programming current and an ability to discern intermediate programming states represented by different resistance levels. The resistivity of lamina 120 may be between the resistivity of the crystalline and amorphous states of the phase change material. The resistivity of the lamina 120 can be significantly lower than the resistivity of the amorphous state of the phase change material, such that it serves as a shunt relative to the amorphous state of the phase change material when the cell is in one or more state(s) that include amorphous regions. For example, resistivity of lamina 120 can be between about $1/1000$ times and $1/10$ times the resistivity of the amorphous state of the PCM material. At the same time, the resistivity of the lamina 120 may be higher than the resistivity of the crystalline state of the phase change material, such the overall resistance of the cell changes discernibly in the reset state, relative to lower resistance states that include amorphous regions. In an embodiment, lamina 120 may be selected to provide a target resistivity of in the range of about 5-200 mΩ·cm. Example materials that may be utilized for lamina 120 may include, but are not limited to, carbon (C) and metallic compounds such as TiSiN, TiAlN, and SiC. Other materials traditionally used for resistors in the integrated circuit industry can also be employed. Of course, claimed subject matter is not limited in these respects.

In an example embodiment, individual storage components comprising both phase change material 110 and lamina 120 may comprise an "L" shape, wherein an approximately vertical portion of an "L" shape comprises an aspect ratio at least partially affected by a thickness of a deposition of phase change material and of a lamina material on an approximately vertical wall of a trench in one dimension. Where the aspect ratio is the ratio of vertical height to horizontal thickness of the vertical portion of the storage component, an increased aspect ratio, for example, may allow for a reduction in programming current, while the phase change material and lamina structure may provide for improved reliability for storage components, e.g., for multi-level storage cells.

Also in an example embodiment, a horizontal portion of the L-shaped storage component, hereafter called lower leg of an L shape, for an individual storage component may contact an electrode positioned between the storage component and a selector transistor. A lower leg of an L-shaped storage component may provide increased contact area with an electrode, providing an improved electrical connection with reduced resistance and further help increase yield during manufacturing. In one or more example embodiments, an increased contact area between a storage component and an electrode may be provided while still providing an increased aspect ratio storage component. In this manner, reduced programming current may be achieved and improved manufacturing yield may also be achieved. Additionally, by including lamina 120 as a shunt relative to amorphous regions of the phase change material 110, drifts over time in resistance characteristics for storage components may be reduced, as the overall storage component resistance depends more upon the lamina 120 resistivity than upon the amorphous phase change material in reset or intermediate states (if any). Furthermore, base line resistivity is reduced relative to the amorphous phase change material alone, leading to larger proportionate differences in resistance for different programming states, thereby providing an improved ability to discern among resistance levels corresponding to respective programming states. However, claimed subject matter is not limited in scope in these respects.

It will be understood, in view of the teachings herein, that the configurations of the phase change material and the lamina need not be as illustrated in order to obtain the shunt function described herein. For example, while illustrated as a layer of conductive lamina 120 between two layers of phase change material 110, in other implementations the storage component may be formed of one layer of lamina material and one layer of phase change material; multiple layers of lamina material alternated with multiple layers of phase change material; a filament of lamina material surrounded by phase change material in cylindrical arrangement; etc.

Figure 2:
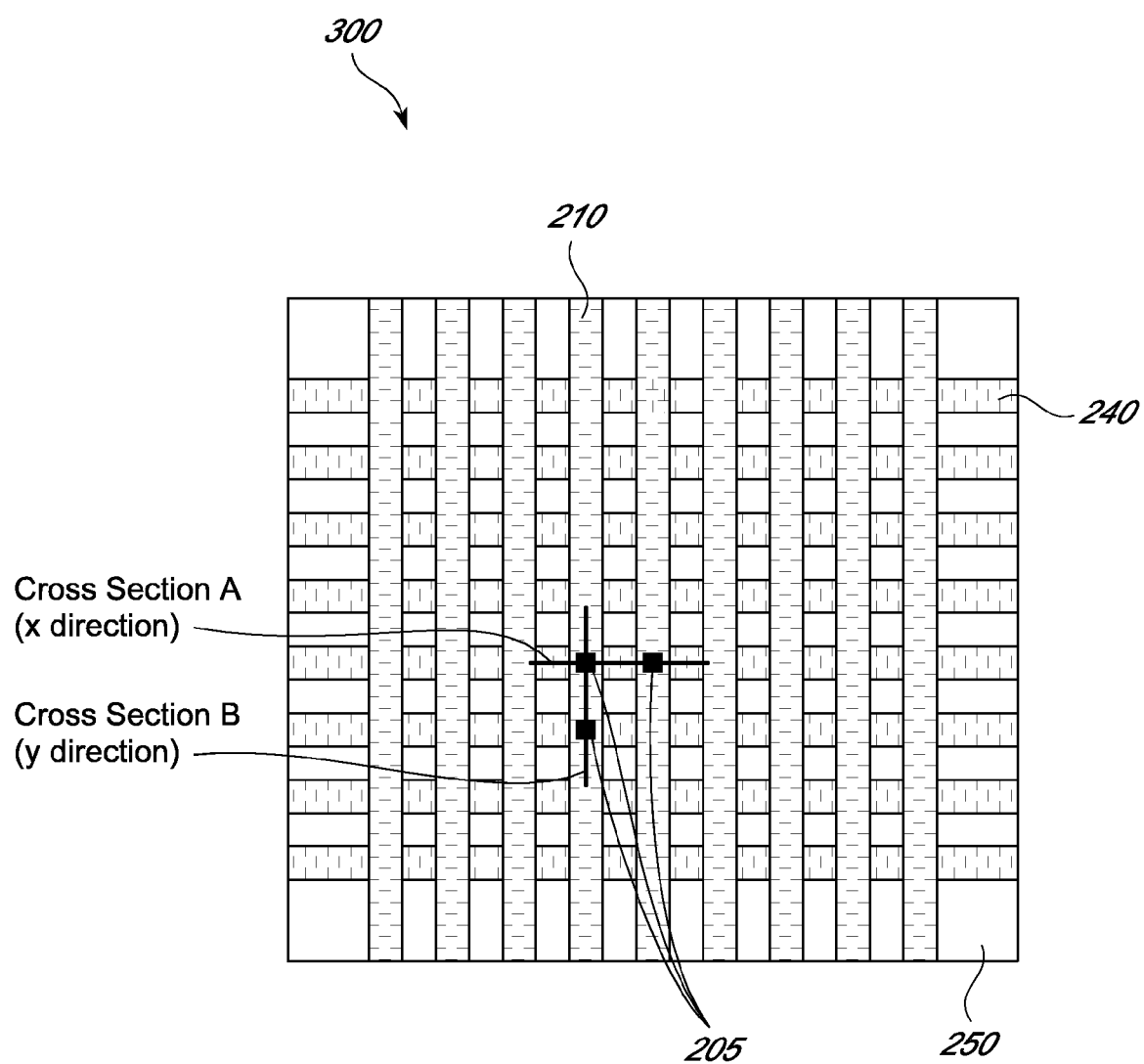
FIG. 2 is an illustration depicting a plan view of a portion of a phase change memory device, according to an embodiment.

FIG. 2 is an illustration depicting a top plan view of a portion of example PCM memory device 300. In an embodiment, a phase change memory device, such as PCM device 300, may be implemented as a cross-point memory array. In an embodiment of a PCM cross-point array, a plurality of electrically conductive lines, referred to as "electrodes" or "electrode lines," may be formed, with one subset of orthogonally directed electrodes in a material positioned below an array of storage components and another subset of crossing (e.g., orthogonally directed) electrodes in a material positioned above the array of storage components. As used herein, the term "cross-point memory array" refers to a memory array having two or more sets of electrodes oriented to cross with one another (e.g., orthogonally). For example, as depicted in FIG. 2, an example embodiment of a cross-point memory array may comprise column electrodes 210, positioned along a direction approximately orthogonal to a direction of row electrodes 240.

An electrically conductive component, such as an "electrode", refers to component that may be utilized to route signals and/or supply voltages within a metal material and/or within a memory array. An electrically conductive component, such as an electrode, may comprise a sufficiently electrically conductive material, such as polysilicon, carbon, and/ or metallic material, such as tungsten, titanium nitride, and/or titanium aluminum nitride, for example, for use in a memory device. Of course, claimed subject matter is not limited in scope in these respects. Other materials may, of course, also be used in other embodiments.

FIG. 2 additionally shows cross-sectional line segments 'A', and 'B' that correspond to cross sectional views A and B in following figures. In an embodiment, storage components 205 of PCM array 300, positioned between electrodes 210 and 240, may be selected and/or accessed in part by energizing appropriate electrodes 240 and/or 210. The electrodes 210 and 240 may be embedded in and separated by insulating material 250.

As mentioned previously, individual storage components may comprise an approximate "L" shape, wherein an approximately vertical portion of an "L" shape comprises an aspect ratio at least partially affected by a thickness of phase change material and of lamina material formed, e.g. deposited, on an approximately vertical wall of a trench in one dimension. An additional trench formed in an approximately orthogonal direction defines another dimension of the "L" shape in such approximately orthogonal direction.

Figure 3A:
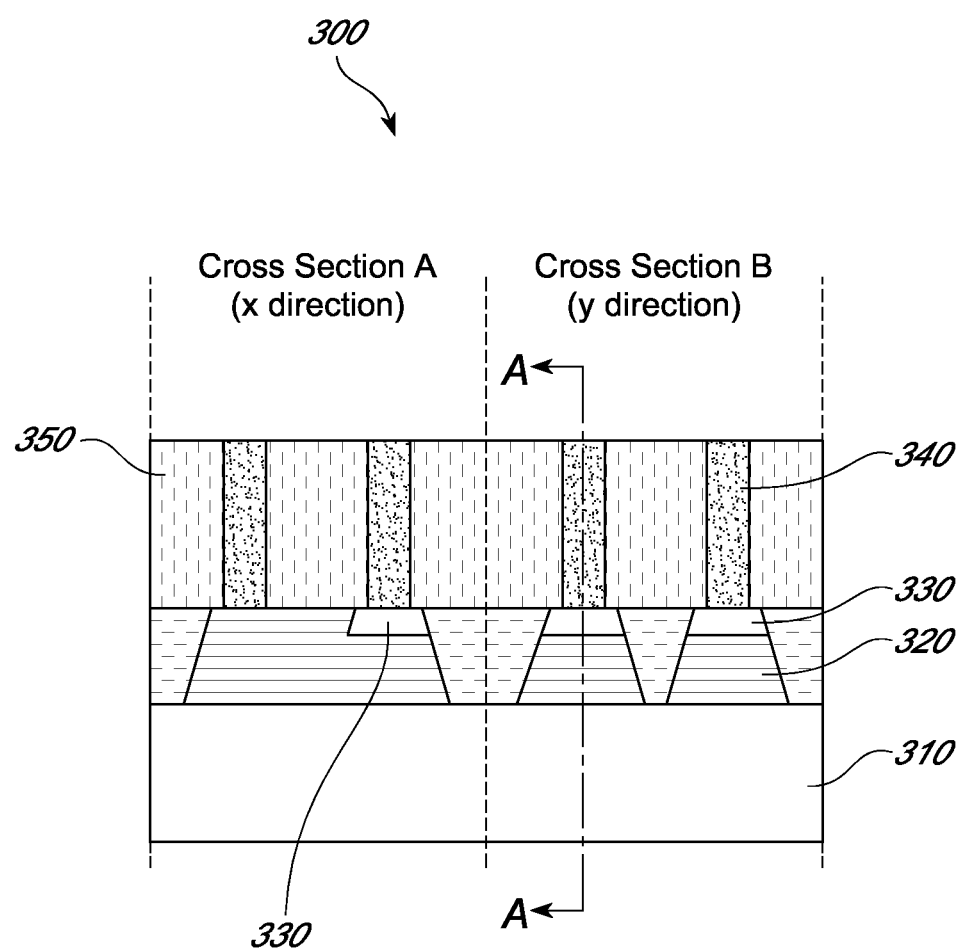
FIGS. 3a-3j are illustrations depicting transverse cross-sectional views of processing stages of a portion of an example technique for forming storage components in a phase change memory array, according to an embodiment.

FIGS. 3a through 3j illustrate an example process of forming PCM array 300 in accordance with an embodiment. Referring to FIG. 3a, Cross Section A depicts a cross-sectional view of a portion of PCM array 300 looking in an 'x' direction, in which the thicknesses of the phase change materials and lamina will be seen in subsequent stages of processing, and Cross Section B depicts a cross-sectional view of a portion of PCM array 300 looking in a 'y' direction that is approximately orthogonal to an 'x' direction, and taken through the middle of a cell such that a width dimension of the phase change materials and lamina will be seen in subsequent stages of processing. FIGS. 3a through 3j depict an example technique for forming at least some aspects of PCM array 300, including forming storage components comprising phase change material and an electrically conductive lamina to counteract resistivity drift in phase change material over time. Of course, claimed subject matter is not limited in scope to the particular examples described herein and as depicted in FIGS. 3a through 3j. Additionally, although a particular configuration of phase change material/lamina is depicted and described herein, claimed subject matter is not limited in scope in these respects. For example, in FIG. 1 and in FIGS. 3a-3j, storage component may comprise a pattern of phase change material/lamina/phase change material. However, other embodiments are possible that may implement a storage component comprising a pattern of lamina/phase change material, and/or a pattern of lamina/phase change material/lamina, for example.

As illustrated in FIG. 3a, a structure has been previously formed comprising a collector material 310, for example, comprising a p-type semiconductor material, such as p-type silicon. A base material 320, for example, comprising an n-type semiconductor material, such as n-type silicon, is also depicted, as is emitter material 330. Emitter material 330 may comprise p-type silicon, in an embodiment. Word lines serving as row electrode lines may be formed in the collector material 310. While the described embodiment is a pnp bipolar junction transistor (BJT), the skilled artisan will appreciate that in other embodiments an npn BJT. A dielectric material 350, such as an oxide material, for example, may be formed by deposition and/or other known processes, and plugs 340 may be formed in holes or vias formed within oxide 350. In an embodiment, plugs 340 may comprise an electrically conductive material, such as tungsten, for example. Additional example materials for plugs 340 may include, but are not limited to, platinum, carbon, titanium nitride, and/or titanium aluminum nitride. A chemical/mechanical planarization process may be utilized over PCM array 300 to produce the structure depicted in FIG. 3a, in an embodiment. The skilled artisan will appreciate that selector devices other than the illustrated BJT may be employed for each cell, and that details of the BJT are not important to the structure of the storage components and methods described below.

Figure 3B:
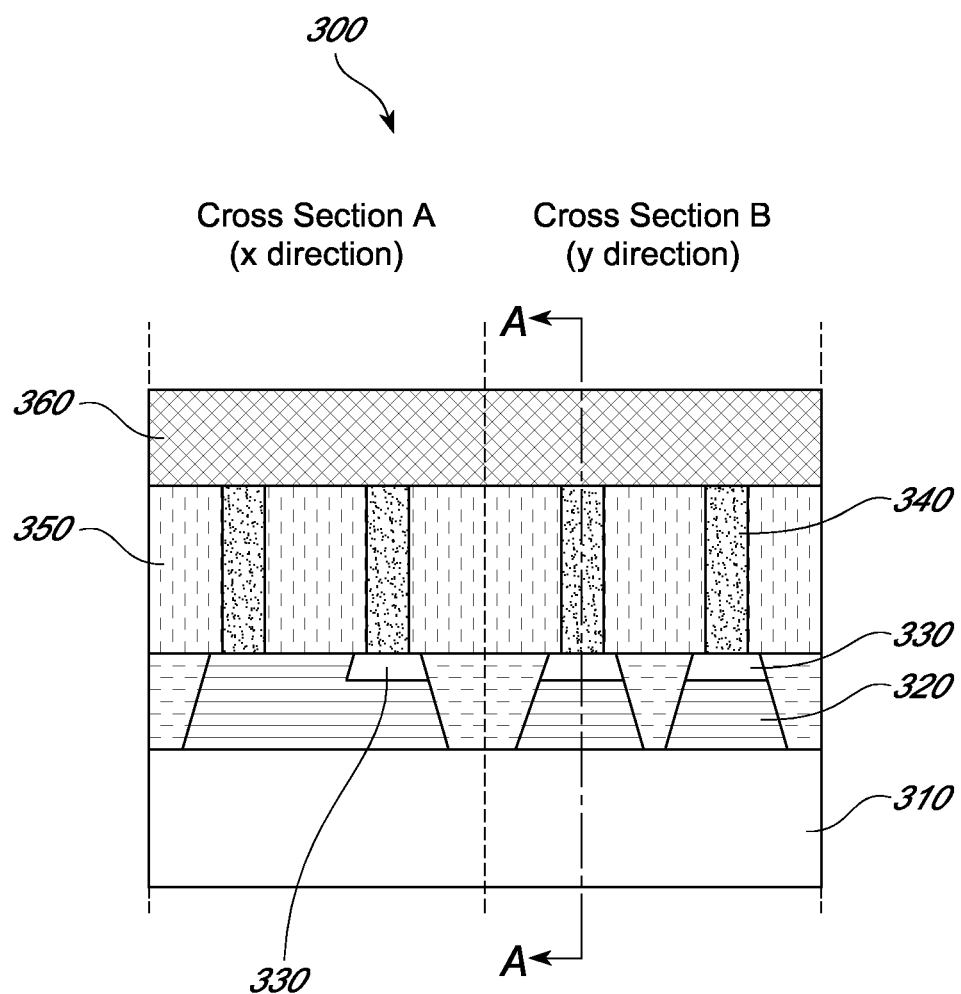

FIG. 3b shows a subsequent stage of the example process following the process described in FIG. 3a. As illustrated in FIG. 3b, a dielectric material 360 may be formed over the PCM array 300. Dielectric material 360 may be formed by deposition and/or other known processes over and/or on dielectric material 350 and plugs 340, in an embodiment. Dielectric material 360 may comprise, for example, silicon nitride and/or silicon oxynitride, in an embodiment. Again, other materials are also possible in other embodiments.

Figure 3C:
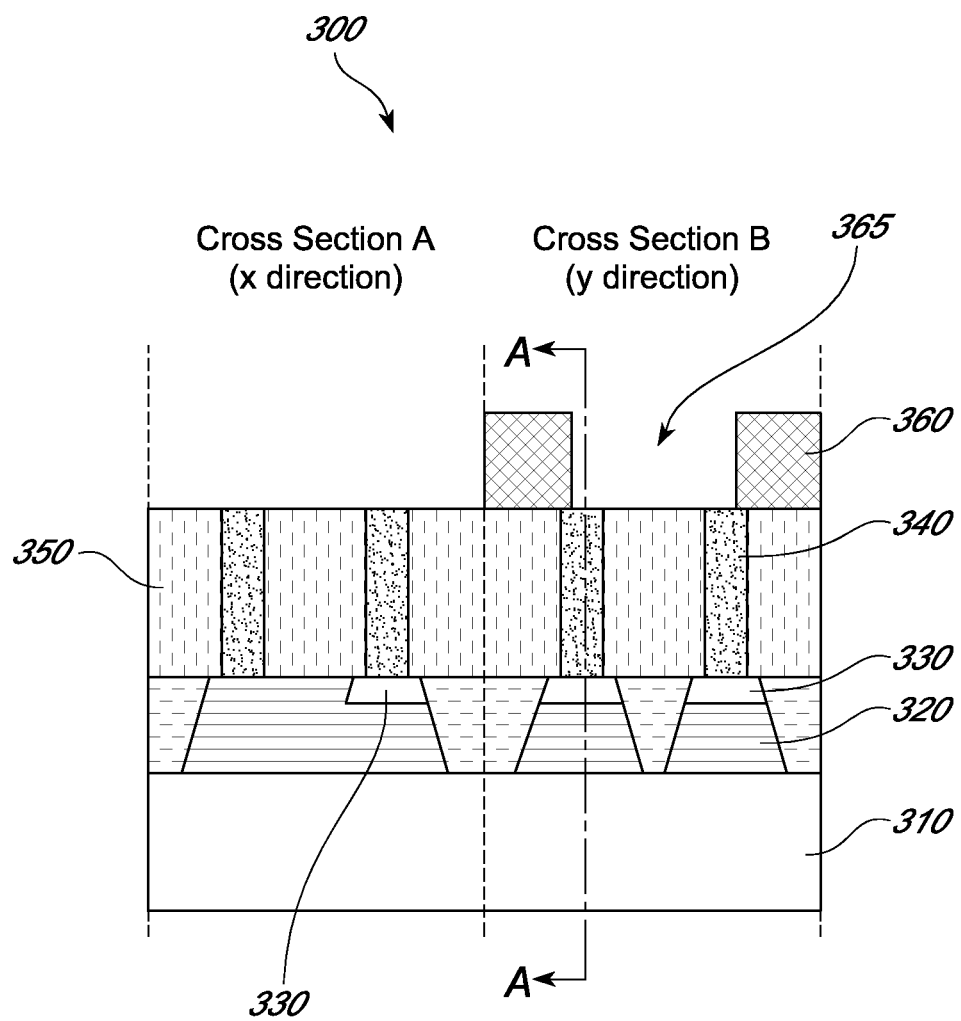

FIG. 3c depicts a subsequent stage of the example process following the process described in FIG. 3b. In an embodiment, a trench 365 may be formed by etching and/or other known processes in dielectric material 360, for example. In an embodiment, an etching process may stop approximately at plugs 340, for example, and at dielectric material 350. In an embodiment, a photoresist etch mask may be formed utilizing a lithographic technique, for example, to substantially protect PCM array 300 outside of an area designated for trench 365 during an etching process, although the scope of claimed subject matter is not limited in this respect.

Figure 3D:
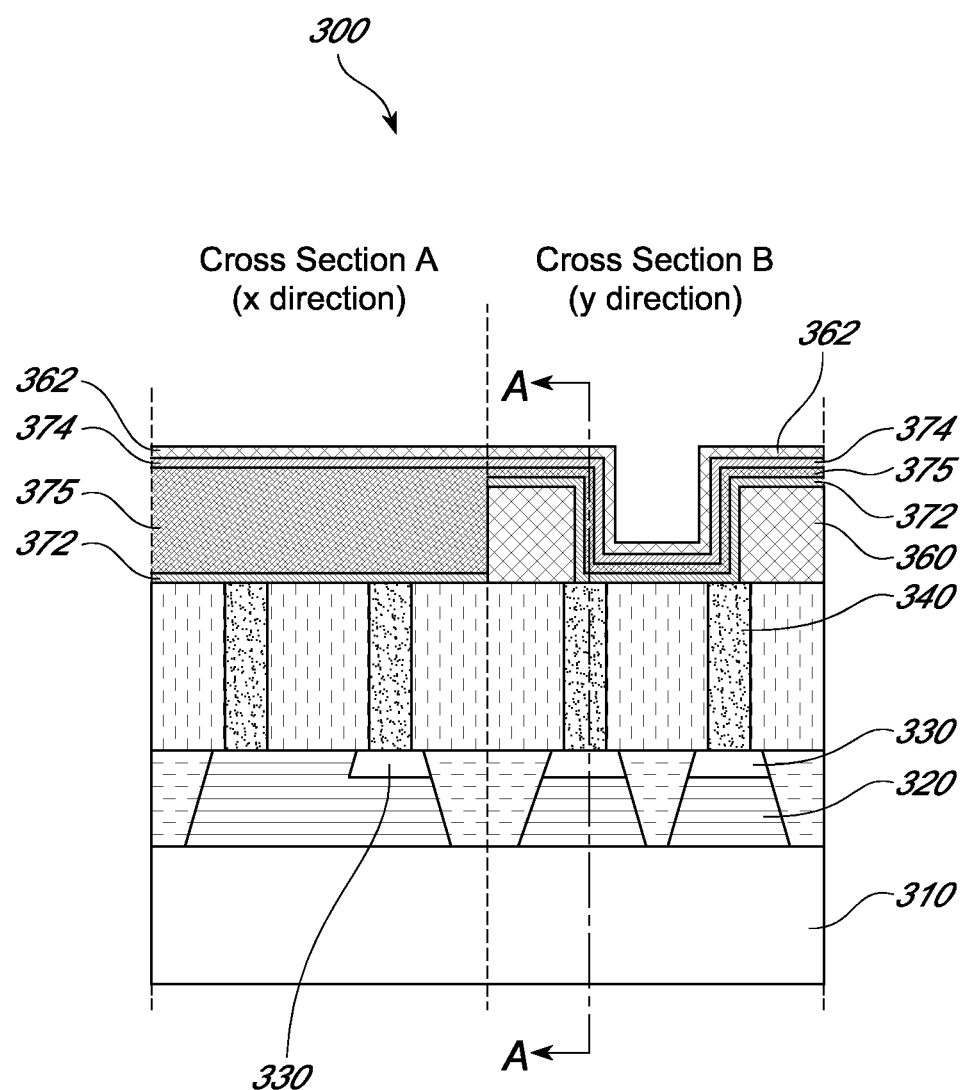

FIG. 3d depicts a subsequent stage of the example process following the process described in FIG. 3c. Storage component material may be formed by deposition and/or other known processes over and/or on a surface of PCM array 300, including within trench 365 and along vertical walls of trench 365. In an embodiment, storage component material may be formed, e.g., deposited, in a conformal manner. In an embodiment, storage component material may comprise a layer of phase change material 372, such as chalcogenide material, a layer of lamina material 375, and another layer of phase change material 374. The layers 372 and 374 of phase change material can comprise, for example, an indium(In)-antimony (Sb)-tellurium(Te) (IST) material, e.g., $In_2Sb_2Te_5$, $In_1Sb_2Te_4$, $In_1Sb_4Te_7$, etc., or a germanium(Ge)-antimony (Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other phase change materials. The hyphenated chemical composition notation, as used herein, indicates the elements included in a particular mixture or compound, and is intended to represent all stoichiometries involving the indicated elements. Other phase change materials include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. In an embodiment, phase change material layers 372 and 374, and lamina layer 375 may be deposited individually, and resistive characteristics of individual storage components may be determined at least in part according to a thickness of deposition of the various layers and the resistivity characteristics of lamina layer 375. As also depicted in FIG. 3d, a dielectric material 362 may be deposited or otherwise formed over PCM array 300, including over phase change material 372, lamina 375, phase change material 374, and within trench 365. In an embodiment, dielectric material 362 may comprise silicon nitride, for example, although claimed subject matter is not limited in this respect. As can be seen from Cross Section A, taken through the lamina 375 the storage component materials may extend in a continuous line along the sidewalls defined by the trench in dielectric material 360. In the illustrated embodiment, where the storage component is deposited on sidewalls, the storage component has an axis of elongation that is vertical. More generally, the axis of elongation will be perpendicular to the thickness of the parallel, deposited layers that make up the storage component.

Figure 3E:
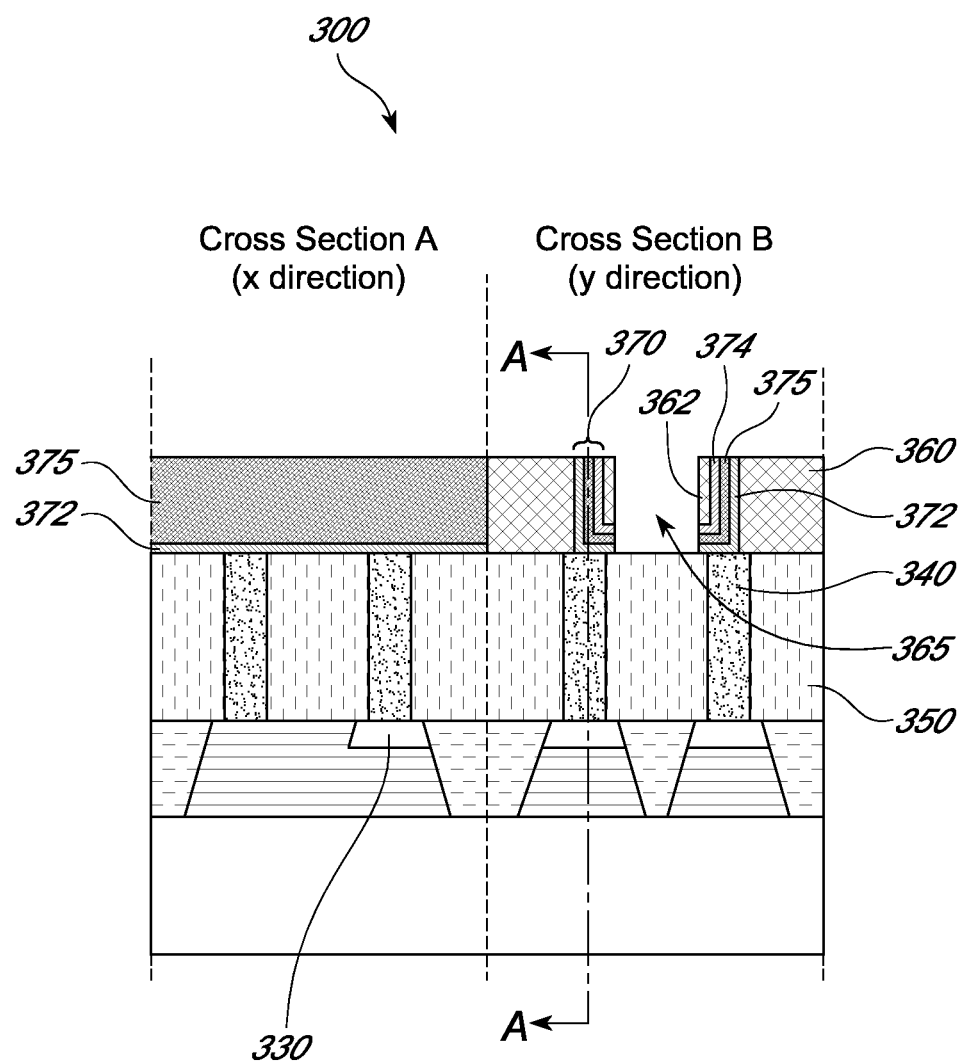

FIG. 3e shows a subsequent stage of the process following the process described in FIG. 3d. As illustrated in FIG. 3e, PCM array 300 may undergo a directional etch-back process to preferentially remove horizontal portions of dielectric material 362 as well as portions of phase change material 372, lamina material 375, and phase change material 374, while leaving protected vertical portions on the sidewalls of trench 365. Portions of phase change material 372, lamina material 375, and phase change material 374 at the bottom of trench 365 may also be removed, as well as portions of dielectric material 362 at the bottom of trench 365. In an embodiment, the etching operation depicted in FIG. 3e may result in formation of "L" shaped storage components 370, comprising phase change material 372, lamina material 375, and phase change material 374. Bottom, horizontal portions of the "L" shaped storage components 370 may contact electrically conductive plugs 340, in an embodiment. Also, in an embodiment, vertical portions of dielectric material 362 within trench 365 may protect storage components 370 (e.g., phase change material 372, lamina material 375 and phase change material 374) during the etching process. Planarization, in an embodiment, may further expose portions of storage components 370 at a top surface of PCM array 300. Also, in an embodiment, an example planarization process may comprise a chemical/mechanical planarization (CMP) technique, although claimed subject matter is not limited in scope in this respect. As used herein, the term "wall" as it relates to a trench refers to an approximately vertical boundary of a trench formed, for example, by an etching process.

Figure 3F:
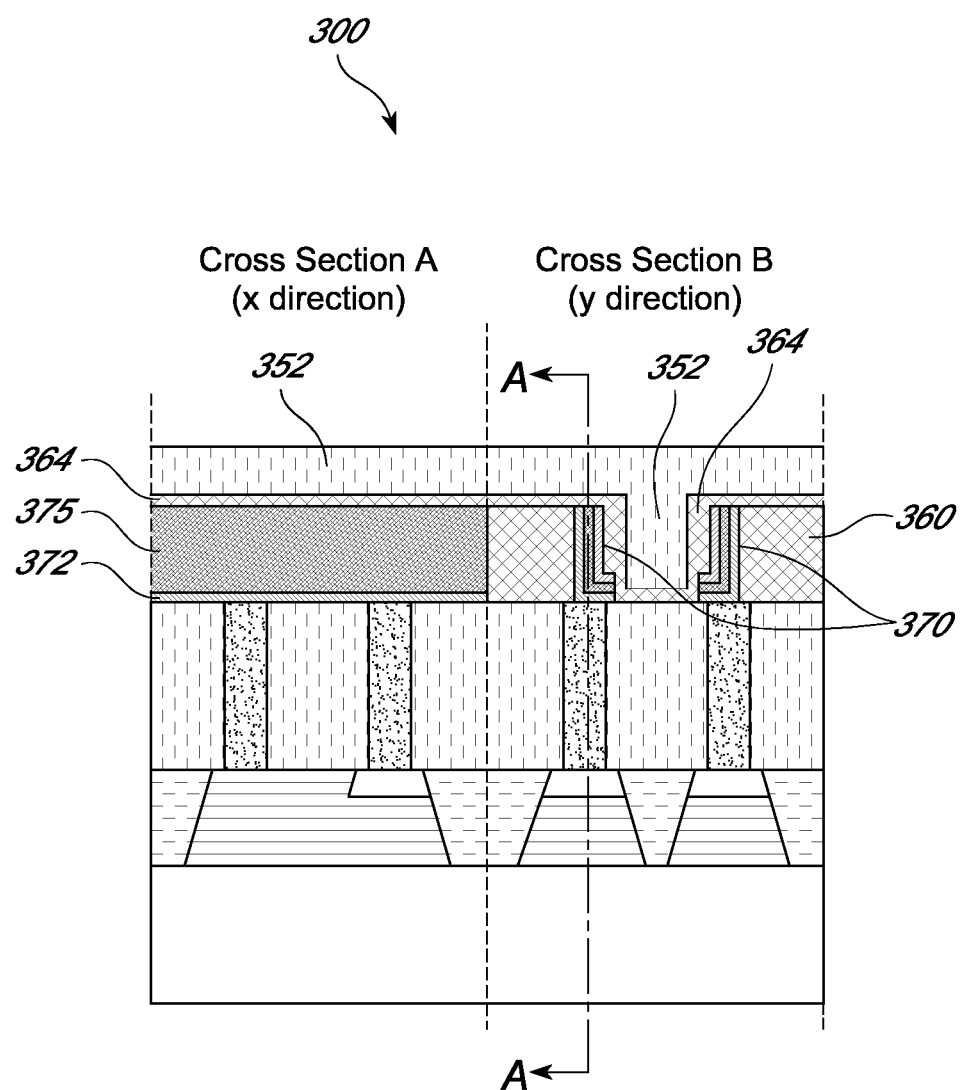

FIG. 3f shows a subsequent stage of the process following the process described in FIG. 3e. As illustrated in FIG. 3f, a dielectric material 364 may be deposited or otherwise formed over and/or on PCM array 300. In an embodiment, dielectric material 364 may be deposited in a substantially conformal manner. Additionally, dielectric material 364 may comprise a nitride material, for example, such as silicon nitride and/or silicon oxynitride, although claimed subject matter is not limited in scope in this respect. As also depicted in FIG. 3f, an additional dielectric material 352 may be deposited over PCM array 300. Dielectric material 352 may comprise a gap-fill silicon oxide material, for example, although again, claimed subject matter is not limited in this respect.

Figure 3G:
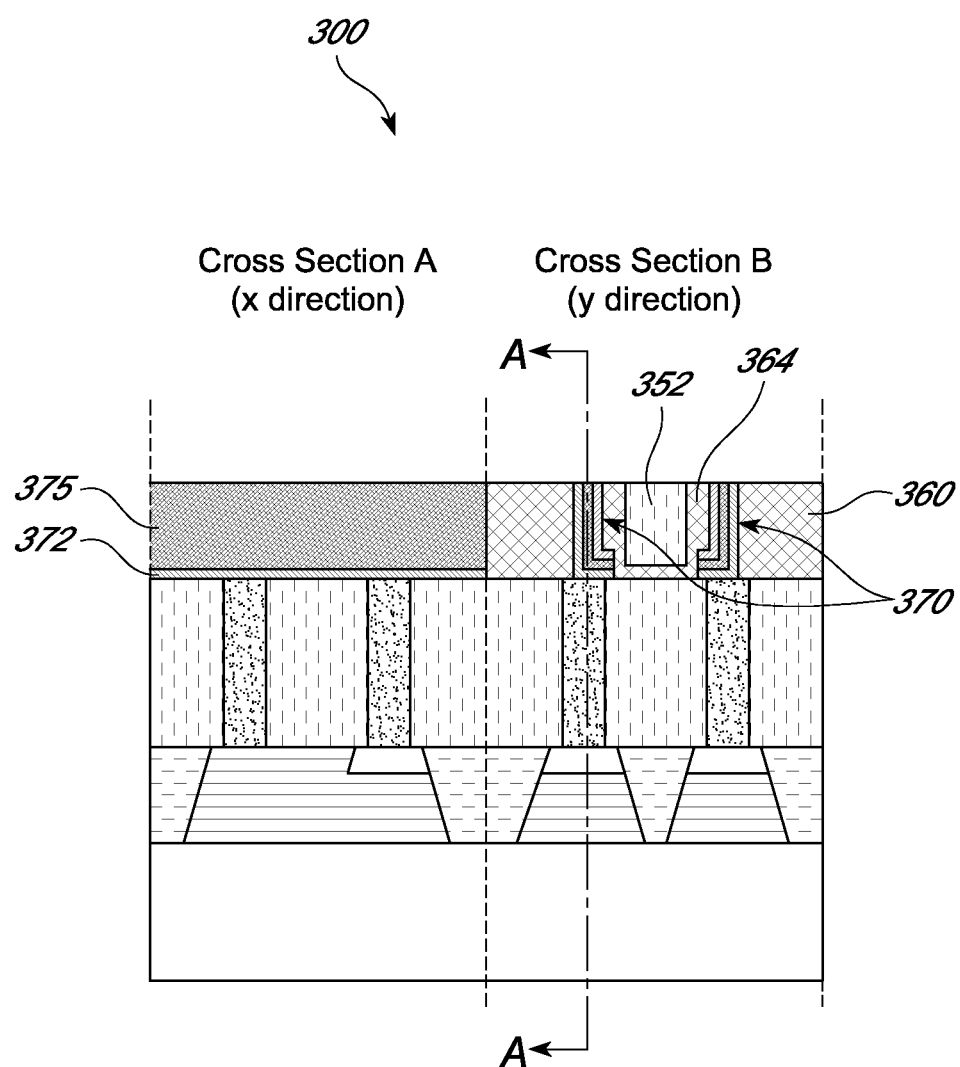

FIG. 3g shows a subsequent stage of the process following the process described in FIG. 3f. As depicted in FIG. 3g, PCM array 300 may undergo a planarization operation, for example a chemical/mechanical planarization operation, to etch back portions of dielectric materials 352 and 364. By etching dielectric materials 352 and 354 via planarization techniques, upper portions of storage components 370 are substantially exposed.

Figure 3H:
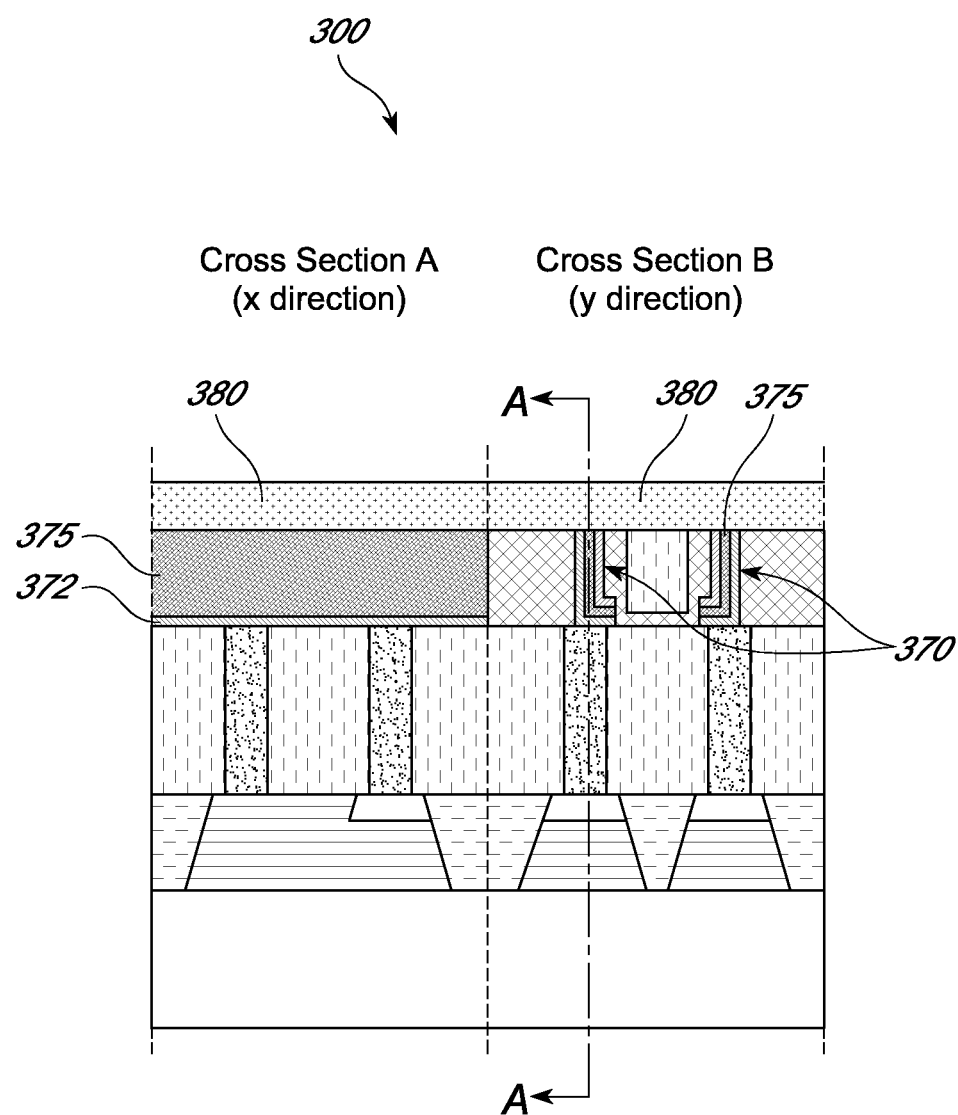

FIG. 3h shows a subsequent stage of the process following the process described in FIG. 3g. As illustrated at FIG. 3h, a metallic material, such as tungsten, may be formed by deposition and/or other known processes over and/or on PCM array 300 to form electrode material 380. Electrode material 380 may comprise, for example, platinum, carbon, titanium nitride, and/or titanium aluminum nitride, among other conductive materials. In an embodiment, electrode material 380 may comprise bit line material, although claimed subject matter is not limited in this respect.

Figure 3I:
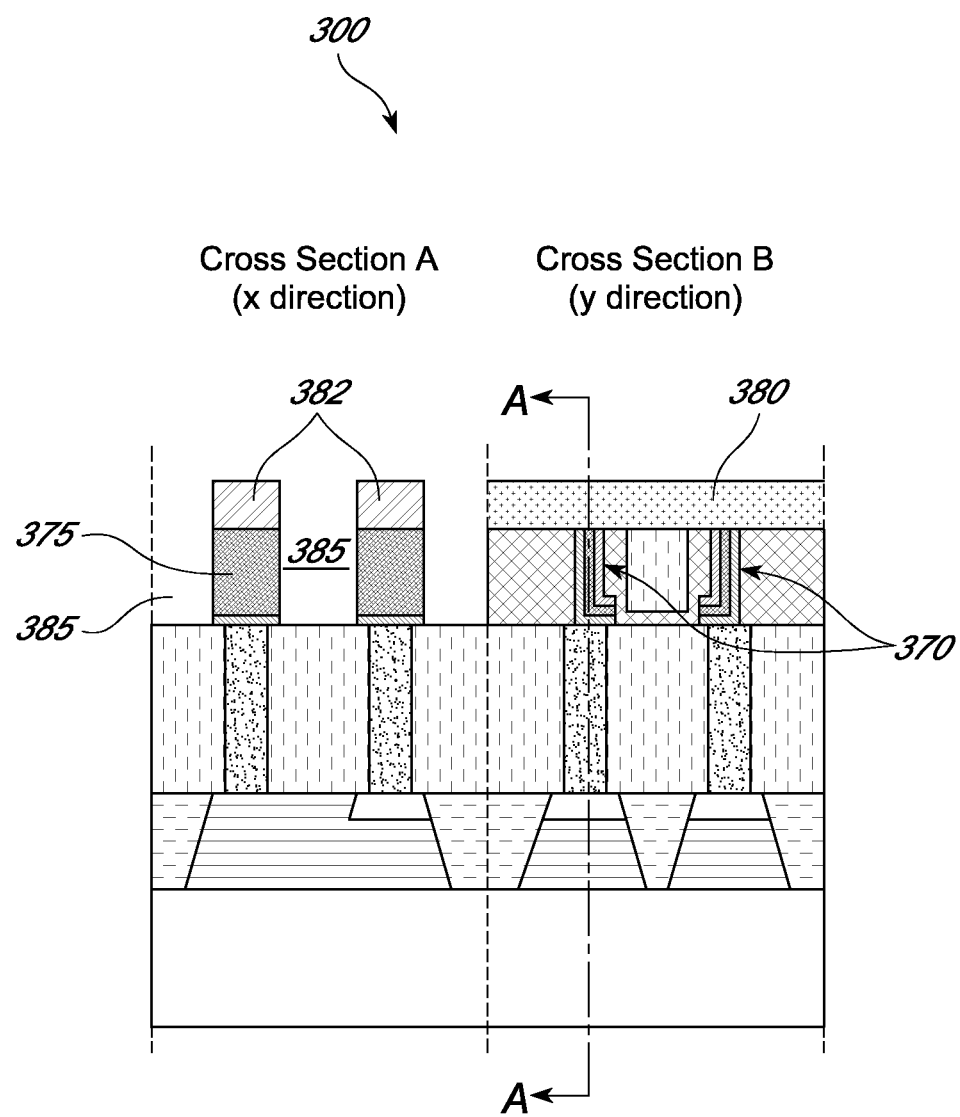

FIG. 3i shows a subsequent stage of the process following the process described in FIG. 3h. As depicted in FIG. 3i, a plurality of trenches 385 may be formed by etching and/or other known processes into PCM array 300 to form column electrode lines in the form of digit lines 382, for example, that run over a column of storage components 370. In an embodiment, trenches 385 may be oriented along a direction approximately orthogonal to trench 365 (FIG. 3e) that was etched to separate the storage components 370 of adjacent cells. In an embodiment, an example etching process may etch sections of electrode material 380, dielectric material and/or dielectric material 354. In an example embodiment, an anisotropic etch may be used.

In an embodiment, an etching process may be accomplished utilizing a photolithographic operation. During the etch process, portions of PCM array 300 not intended to be etched may be protected by a mask (not shown). Additionally, it may be noted that trenches 385 may define an additional dimension of storage components 370, namely the dimension extending in the x-direction, which can be referred to as a lateral width. However, claimed subject matter is not limited in scope in these respects.

Figure 3J:
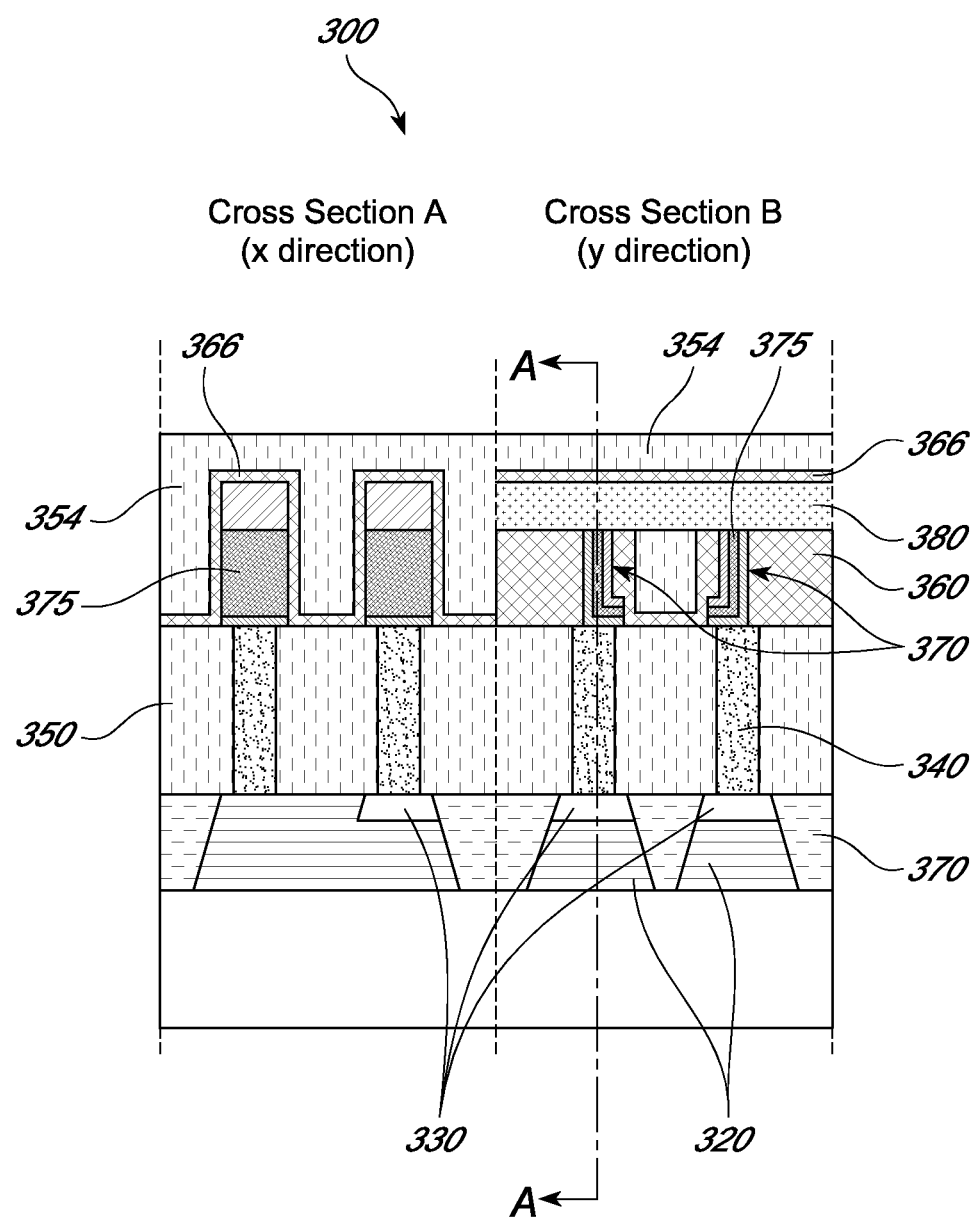

FIG. 3j shows a subsequent stage of the process following the process described in FIG. 3i. As illustrated in FIG. 3j, additional dielectric material, such as nitride 366 for sealing and/or oxide 354 for gap-fill planarization, may be deposited over and/or on PCM array 300 and within trenches 385 to encapsulate storage components 370, in an embodiment. Deposition of additional dielectric materials 354 and 366 may provide structural stability, as well as electrical isolation for individual storage components of PCM array 300. However, claimed subject matter is not limited in scope in these respects.

In a fabrication process in accordance with another implementation, lamina 375 (see FIG. 3e) can be formed in other ways. For example, a process similar to the illustrated process can employ a sacrificial placeholder material in place of lamina 370 up to the stages of FIG. 3e or 3g; the sacrificial placeholder material can be partially or fully removed, e.g., by selective etching, from between segments of phase change material 372 and 374, and the gap left thereby can be refilled with a shunt material with resistivity characteristics as described above. Such a process can be useful where a material that is not easily dry etched, such as copper, is desired for the lamina. Other fabrication techniques can be employed depending upon the desired orientation Referring again to FIG. 1, the storage component of a PCM device includes a phase change material 110 and a lamina 120 that can serve as a shunt in operation. The phase change material 110 can be crystalline in a set state, and can be at least partially amorphous, such as the illustrated amorphous region 115, in a reset state and in any intermediate resistive states (in a multilevel PCM implementation). The lamina 120 of the illustrated implementation is vertical and shown to be embedded within the phase change material 110; in other implementations the lamina can have other orientations and/or may not be embedded. In one example, the storage component can be oriented with its axis of elongation extending horizontally rather than vertically. In another example, one layer of phase change material can be formed adjacent to a lamina that serves as a shunt relative to the more resistive amorphous state of the phase change material, without the illustrated embedded or sandwiched arrangement. In the illustrated implementation, lamina 120 has a long dimension that extends between two electrodes 130 and 140. Lamina 120 is shown as contacting one of the electrodes 130 and not contacting the other electrode 140; in other implementations the lamina 120 may contact both or neither of the electrodes. Lamina 120 is positioned, and its resistivity selected, such that it can serve as a shunt around amorphous portions 115 of the phase change material 120 in operation, but its resistivity is high enough relative to crystalline portions of the phase change material 120 that resistivity changes for the overall cell are detectable when the state is changed, e.g., from amorphous to crystalline or vice versa.

In operation, in one implementation, assuming an initial a SET or crystalline (relatively low resistivity) state, applying a read current through the storage component (including both phase change material 110 and lamina 120), most of the current flows through the crystalline phase change material 110 due to selection of a relatively thin and more resistive lamina 120. A read current can be produced applied by applying a relatively reference potential (e.g., about 0.2 volt) across the electrodes.

A higher potential can be applied for a programming operation, whereby sufficient current flows to heat and at least partially melt the phase change material. The phase change material can act, in the illustrated implementation, as a self-heater though Joule heating. For example, applying a programming signal (e.g., current pulse) can put the cell in a RESET state, in which amorphous region 115 forms sufficient to detectibly alter the resistance of the cell. Due to the relatively small dimensions, the amorphous region 115 can span the width (transverse to the direction of current flow) of the storage component. Because lamina 120 is less resistive than the amorphous region 115, current flows through 120 lamina, which influences the overall resistance of the cell, which is higher than the crystalline phase change material and thus represents a detectible change. Because lamina 120 more strongly influences the cell's resistance in the RESET state, resistance drift of the phase change material is of diminished influence on the resistance of the memory cell. A relatively low reference potential (e.g., about 0.2 volt) across the electrodes can produce a read current that is lower than the read current produced by the SET state.

In a multilevel PCM implementation, the read and programming can be as described above with respect to a SET state. Furthermore, RESET and INTERMEDIATE states enjoy similar advantages of having their resistances influenced more strongly by the resistivity of the shunt formed by lamina 120 than by the resistivity of amorphous region(s) 115 of the phase change material. Moreover, additional advantages may be conferred with respect to differentiation among multiple states. In programming RESET or INTERMEDIATE states, amorphous region 115 a programming signal (e.g., current pulse) can be applied to induce Joule heating within the storage component, which can cause the amorphous region to lengthen along the direction of current flow (between the electrodes 130 and 140). Accordingly, the length of lamina 120 that operates as a shunt grows commensurately, and the overall resistance of the cell is accordingly affected; the greater than amorphous region 115, the longer the shunt and the lower the resistance of the cell relative to the SET state. Because lamina 120 is more conductive than the amorphous region(s) 115, differences in resistance due to lengthening of the amorphous region(s) 115 and shunt are more readily discerned, as compared to a PCM device without a shunt. The greater the amorphous region(s) 115, the lower the read current produce by a relatively low reference (e.g., about 0.2 volt) across the electrodes.

From a RESET or INTERMEDIATE state, application of programming signal (e.g., current pulse) to re-crystallize the phase change material can again be accomplished by Joule heating by the storage component itself. Both the phase change material 110 and the lamina 120 are part of the storage component and may contribute to self-heating to attain crystallization. The phase change material 110 and the lamina 120 are approximately co-extensive and parallel along their axis of elongation, and because they are deposited layers both can be made thin. Accordingly, the cell occupies considerably less volume than designs employing separate heaters.

Figure 4:
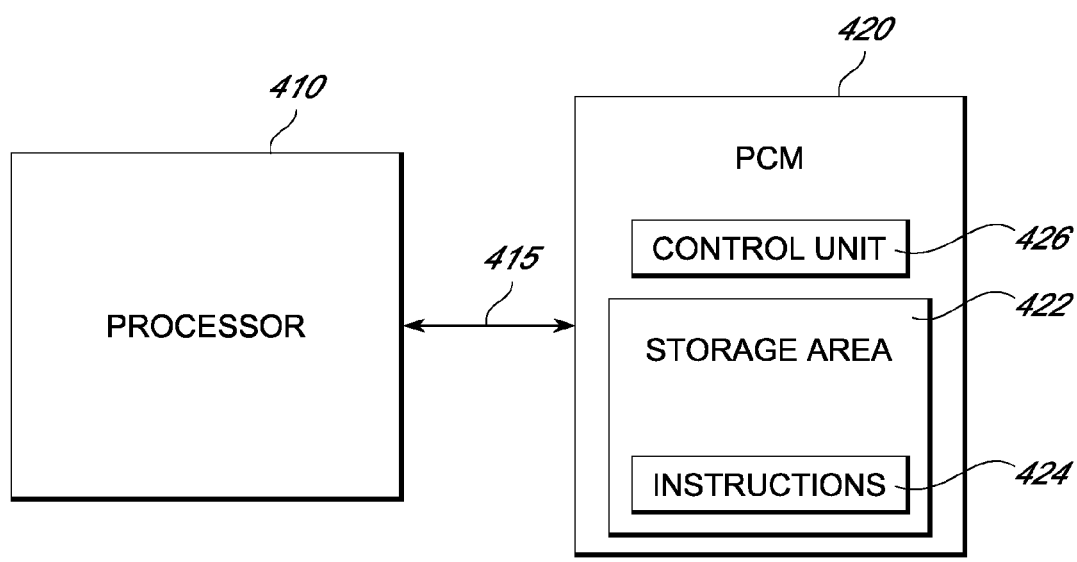
FIG. 4 is a schematic block diagram depicting a system, including a cross-point array memory device, according to an embodiment.

FIG. 4 is a schematic block diagram depicting an example system 400 including an example PCM device 420. In an embodiment, PCM device 420 may comprise a storage area 422 including a PCM cross-point memory array, such as in accordance with one or more of examples. PCM device 420 may, in an example embodiment, be coupled to a processor 410 by way of an interconnect 415.

PCM device 420 in an embodiment may comprise a control unit 426. Additionally, storage area 422 may store instructions 424 that may include one or more applications that may be executed by processor 410, according with an embodiment. Processor 410 may transmit a memory access command to PCM 420, for example. Control unit 426 may access one or more memory cells of storage area 422 at least in part in response to receiving the memory access command from processor 410, according to an embodiment. Of course, computing platform 400 is merely one example of a system implemented in accordance with claimed subject matter, and the scope of claimed subject matter is not limited in these respects. The processor 410 can be configured or programmed to operate the PCM 420 as a multi-level phase change memory, whereby a plurality of memory cells of the PCM storage area 422 can store more than two logic states.

The term "computing platform" as used herein refers to a system and/or a device that includes the ability to process and/or store data in the form of signals or states. Thus, a computing platform, in this context, may comprise hardware, software, firmware or any combination thereof (other than software per se). Computing platform 400, as depicted in FIG. 4, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, or any combination of the above. Further, unless specifically stated otherwise, a process as described herein, with reference to flow diagrams or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

Methodologies described herein may be implemented by various techniques depending, at least in part, on applications according to particular features and/or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other device units designed to perform function described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

What is claimed is:

1. A memory device, comprising:
   a first electrode;
   a second electrode; and
   a self-heating storage component between the first electrode and the second electrode, the storage component comprising a phase change material extending between the first and second electrode and further comprising an electrically conductive lamina material, wherein the lamina material extends partially across the phase change material to contact one but not the other of the first and second electrodes to serve as an electrical shunt across a portion of the phase change material between the first and second electrodes.

2. The memory device of claim 1, wherein the phase change material and the conductive lamina material are parallel layers co-extensive along an axis of elongation.

3. The memory device of claim 1, wherein the storage component extends vertically between the first electrode and the second electrode.

4. A memory device, comprising:
   a first electrode;
   a second electrode; and
   a self-heating storage component between the first electrode and the second electrode, the storage component comprising a phase change material and an electrically conductive lamina material having a resistivity and position to serve as a shunt across portions of the phase change material,
   wherein the storage component comprises a substantially L-shaped storage component having a substantially vertical portion extending from the first electrode positioned below the storage component to the second electrode positioned above the storage component, the substantially vertical portion comprising one or more layers of the phase change material and one or more layers of the electrically conductive lamina material.

5. The memory device of claim 4, wherein the substantially L-shaped storage component further comprises a substantially horizontal portion comprising one or more layers of the phase change material and one or more layers of the electrically conductive lamina material.

6. The memory device of claim 4, wherein the electrically conductive lamina material is positioned between two layers of the phase change material.

7. The memory device of claim 4, wherein the one or more layers of the phase change material and the one or more layers of the electrically conductive lamina material comprise a substantially alternating pattern of the phase change material and the electrically conductive lamina material.

8. The memory device of claim 4, wherein the one or more layers of phase change material and the one or more layers of electrically conductive lamina material comprise one layer of electrically conductive lamina material positioned between two layers of phase change material.

9. The memory device of claim 1, wherein the phase change material comprises one or more layers of chalcogenide material.

10. The memory device of claim 1, wherein the electrically conductive lamina material comprises one or more of TiSiN, TiAlN, C, and SiC.

11. A system including an integrated circuit, the integrated circuit comprising:
    a first memory cell electrode;
    a second memory cell electrode; and
    a phase change storage component formed between the first memory cell electrode and the second memory cell electrode, the phase change storage component including a phase change material extending between the first and second memory cell electrodes and further including a conductive lamina material, the phase change material and the conductive lamina material being parallel layers coextensive along an axis of elongation of the phase change storage component, wherein the lamina material extends partially across the phase change material to contact one but not the other of the first and second memory electrodes to serve as an electrical shunt across a portion of the phase change material between the first and second memory cell electrodes.

12. The system of claim 11, wherein the conductive lamina material has a resistivity between a resistivity of a crystalline state of the phase change material and a resistivity of an amorphous state of the phase change material.

13. The system of claim 12, wherein the resistivity of the conductive lamina material is between about 5 mΩ·cm and 50 mΩ·cm.

14. The system of claim 11, wherein the conductive lamina material has an L-shape including a vertical portion and a horizontal portion.

15. The system of claim 11, further comprising a processor configured to operate the phase change memory component as a multi-level storage cell capable of storing more than two information states.

16. The system of claim 11, wherein the axis of elongation of the phase change storage component is vertically oriented between the first and second electrodes.

17. A method of forming a memory device, comprising:
    forming a self-heating storage component comprising a phase change material extending between a first electrode and a second electrode, the storage component further comprising an electrically conductive lamina shunted to the phase change material, wherein forming the storage component comprises forming the lamina material which extends partially across the phase change material to contact one but not the other of the first and second electrodes to serve as an electrical shunt across a portion of the phase change material between the first and second electrodes.

18. The method of claim 17, wherein forming the storage component comprises forming the phase change material and the electrically conductive lamina on a substantially vertical wall of a first trench positioned along a first direction in a dielectric material of a memory array.

19. The method of claim 18, wherein forming the storage component comprises forming the phase change material in a substantially conformal manner.

20. The method of claim 19, wherein forming the storage component comprising the phase change material comprises forming a chalcogenide material.

21. The method of claim 20, wherein forming the storage component further comprises forming the electrically conductive lamina in a substantially conformal manner and over the phase change material.

22. The method of claim 17, wherein forming the storage component comprises forming in a conformal manner one or more layers of the phase change material and one or more layers of the electrically conductive lamina material in a substantially alternating configuration.

23. The method of claim 17, wherein forming the storage component comprises depositing in a conformal manner the one or more layers of the phase change material and the one or more layers of the electrically conductive lamina material in a substantially alternating configuration on a substantially vertical wall of a first trench.

24. The method of claim 23, further comprising depositing an electrode material over the planarized top surface of the memory device.

25. The method of claim 24, wherein the first trench is positioned along a first direction, the method further comprising etching one or more additional trenches positioned along a direction crossing with the first direction.

26. A method of operating a phase change memory, comprising:
receiving one or more signals indicative of a memory access command from a processor of a computing platform; and
accessing an array of self-heating storage components individually comprising one or more layers of phase change material extending between a first electrode and second electrode and in substantially direct contact with one or more layers of electrically conductive lamina material shunted to the one or more layers of phase change material, accessing the array being caused at least in part in response to receiving the memory access command, wherein the accessing includes changing a state of one or more storage components of the array of storage components, wherein the lamina material extends partially across the phase change material to contact one but not the other of the first and second electrodes to serve as an electrical shunt across a portion of the phase change material between the first and second electrodes.

27. The method of claim 26, wherein accessing the array of storage components further comprises applying a programming signal corresponding to a specified programming state of a plurality of states.

28. The method of claim 27, further comprising applying additional programming signals to change the states of the one or more storage components among greater than two states.

29. The method of claim 27, wherein applying the programming signal comprises inducing an amorphous region in the one or more layers of phase change material.

30. The method of claim 27, further comprising reading the specified programming state at least in part by determining a collective resistance of the one or more layers of phase change material and the one or more layers of electrically conductive lamina material.

31. The method of claim 30, wherein reading the specified programming state comprises shunting read current across the amorphous region through the electrically conductive lamina material.

32. The method of claim 21, further comprising filling the first trench with an additional dielectric and planarizing a top surface of the memory device to remove a portion of the additional dielectric material and portions of the one or more layers of phase change material and portions of the one or more layers of electrically conductive lamina material not located within the first trench, and to expose one or more top edges of approximately vertical portions of the one or more layers of phase change material and the one or more layers of electrically conductive lamina material deposited on the substantially vertical wall of the first trench.

* * * * *